(12) United States Patent
Darmawikarta et al.

(10) Patent No.: US 10,978,399 B2
(45) Date of Patent: Apr. 13, 2021

(54) DIE INTERCONNECT SUBSTRATE, AN ELECTRICAL DEVICE, AND A METHOD FOR FORMING A DIE INTERCONNECT SUBSTRATE

(71) Applicant: Intel Corporation, Santa Clara, CA (US)

(72) Inventors: Kristof Darmawikarta, Chandler, AZ (US); Robert Alan May, Chandler, AZ (US); Sri Ranga Sai Sai Boyapati, Chandler, AZ (US); Wei-Lun Kane Jen, Chandler, AZ (US); Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,589

(22) PCT Filed: Mar. 31, 2017

(86) PCT No.: PCT/US2017/025230
§ 371 (c)(1),
(2) Date: Jun. 28, 2019

(87) PCT Pub. No.: WO2018/182658
PCT Pub. Date: Oct. 4, 2018

(65) Prior Publication Data
US 2020/0051915 A1    Feb. 13, 2020

(51) Int. Cl.
*H01L 23/538* (2006.01)
*H01L 21/48* (2006.01)
*H01L 21/768* (2006.01)
*H01L 23/13* (2006.01)
(Continued)

(52) U.S. Cl.
CPC ........ *H01L 23/5381* (2013.01); *H01L 21/486* (2013.01); *H01L 21/76873* (2013.01);
(Continued)

(58) Field of Classification Search
CPC .............. H01L 23/5381; H01L 21/486; H01L 21/76873; H01L 21/76879; H01L 23/13;
(Continued)

(56) References Cited

U.S. PATENT DOCUMENTS 8,901,748 B2 * 12/2014 Manusharow ...... H01L 23/5386
257/777
9,136,236 B2 * 9/2015 Starkston ................ H01L 25/50
(Continued)

FOREIGN PATENT DOCUMENTS

KR    1020060047178 A    5/2006

*Primary Examiner* — Vu A Vu
(74) *Attorney, Agent, or Firm* — Schwabe, Williamson & Wyatt, P.C.

(57) ABSTRACT

A die interconnect substrate comprises a bridge die comprising at least one bridge interconnect connecting a first bridge die pad of the bridge die to a second bridge die pad of the bridge die. The die interconnect substrate comprises a multilayer substrate structure comprising a substrate interconnect, wherein the bridge die is embedded in the multilayer substrate structure. The die interconnect substrate comprises a via portion formed on the first bridge die pad of the bridge die. An average angle between a surface of the first bridge die pad and a sidewall of the via portion lies between 85° and 95°.

25 Claims, 8 Drawing Sheets

(51) Int. Cl.
   *H01L 23/495* (2006.01)
   *H01L 23/532* (2006.01)

(52) U.S. Cl.
   CPC ........ *H01L 21/76879* (2013.01); *H01L 23/13* (2013.01); *H01L 23/49506* (2013.01); *H01L 23/5385* (2013.01); *H01L 23/53228* (2013.01)

(58) Field of Classification Search
   CPC ......... H01L 23/49506; H01L 23/53228; H01L 23/5385; H01L 25/0655; H01L 2224/171; H01L 24/81; H01L 24/17; H01L 2224/81801; H01L 24/16; H01L 2224/16225; H01L 2224/16227; H01L 2924/181; H01L 2924/10253; H01L 24/13; H01L 2224/13101; H01L 2924/15192; H01L 2924/15311; H01L 23/538; H01L 23/5226; H01L 23/00; H01L 23/48

USPC ........................................................ 257/774
   See application file for complete search history.

(56) References Cited

U.S. PATENT DOCUMENTS 9,397,070 B2 *   7/2016   Tao ..................... H01L 23/5389
   9,997,446 B2 *   6/2018   Kim ................... H01L 21/6835
   2012/0068342 A1 * 3/2012   Lee ................... H01L 21/76898
                                                      257/746
   2012/0261838 A1  10/2012  Braunisch et al.
   2014/0264791 A1  9/2014   Manusharow et al.
   2015/0028486 A1  1/2015   Liu et al.
   2015/0048515 A1  2/2015   Zhang et al.
   2016/0079196 A1  3/2016   Teh et al.
   2016/0148887 A1 * 5/2016   Yu ...................... H01L 23/3128
                                                      257/773

* cited by examiner

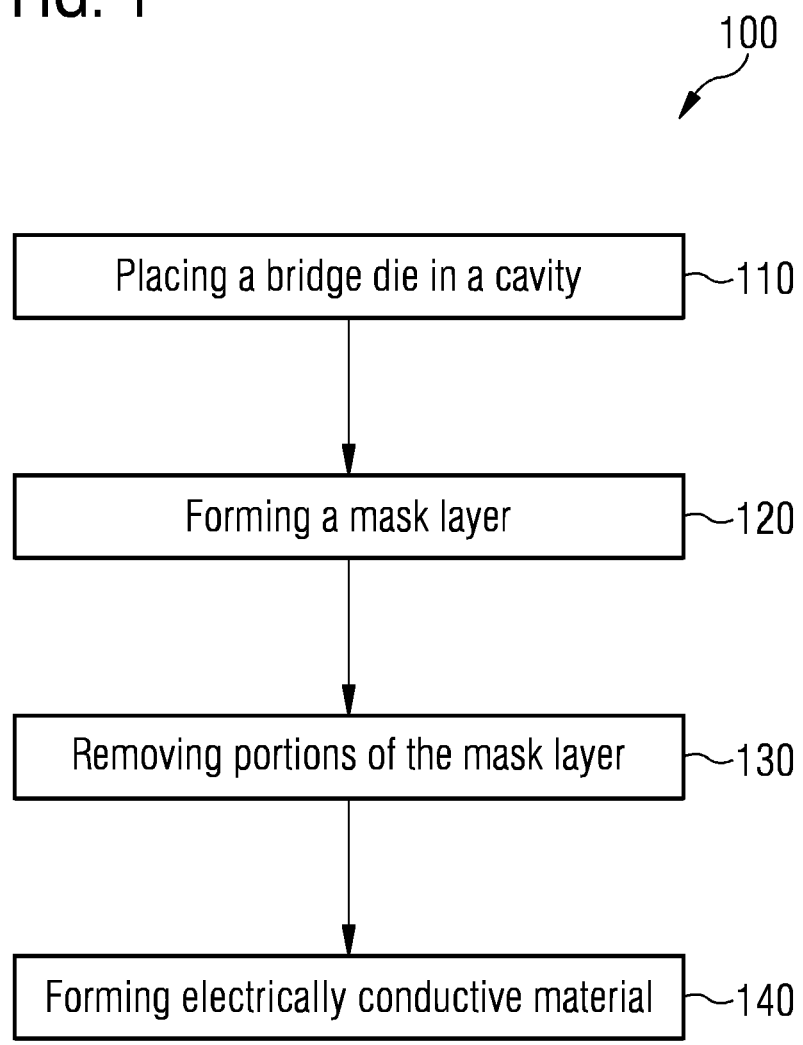

FIG. 2G
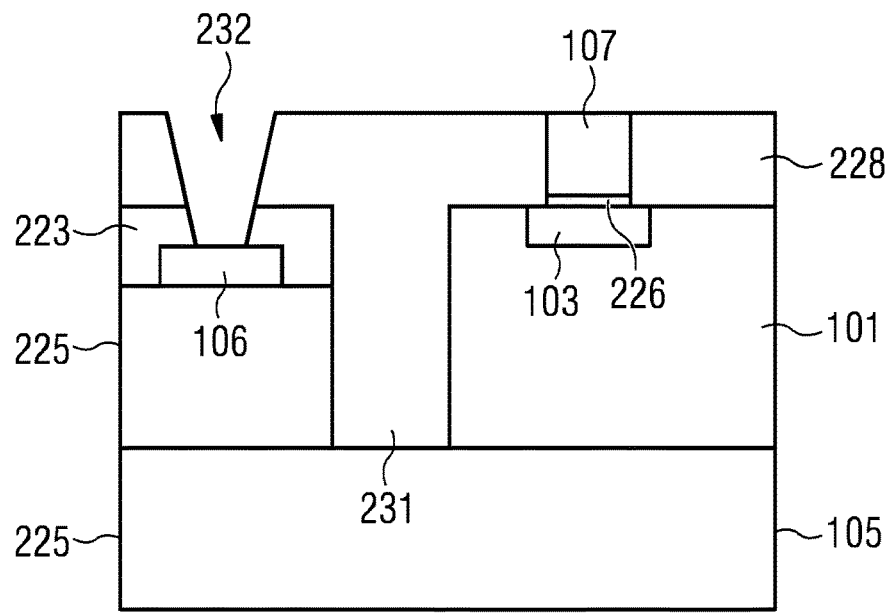
FIG. H
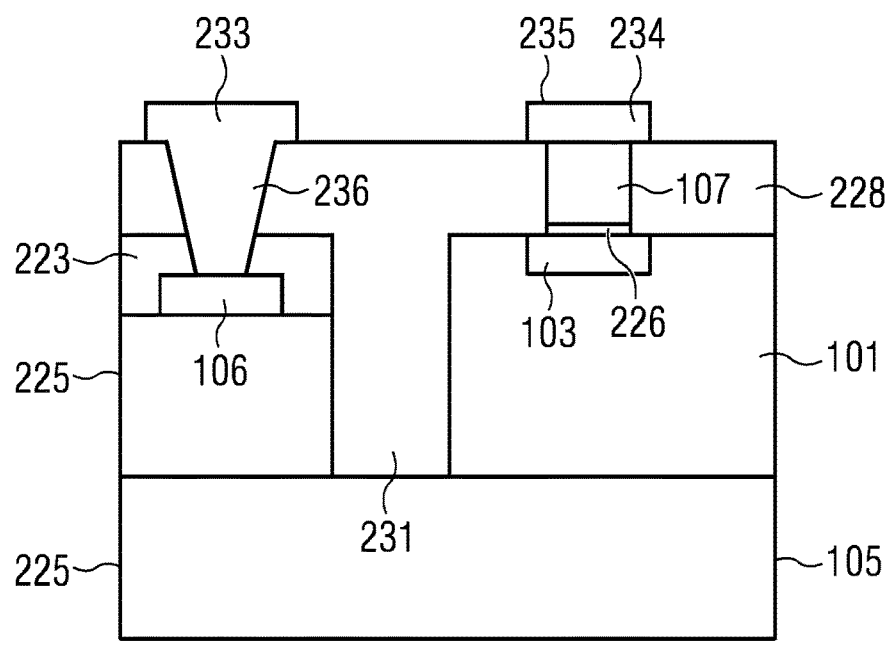

DIE INTERCONNECT SUBSTRATE, AN ELECTRICAL DEVICE, AND A METHOD FOR FORMING A DIE INTERCONNECT SUBSTRATE

CROSS-REFERENCE TO RELATED APPLICATIONS

This patent application is a U.S. National Phase Application under 35 U.S.C. § 371 of International Application No. PCT/US2017/025230, filed on Mar. 31, 2017, the entire contents of which is hereby incorporated by reference herein.

TECHNICAL FIELD

Examples relate to concepts for die interconnects, and in particular to a die interconnect substrate, an electrical device, and a method for forming a die interconnect substrate.

BACKGROUND

Semiconductor devices can include semiconductor dies, which are attached or connected to substrates via solder structures. Large bump pitch between solder structures can lead to larger devices being produced and also to higher costs. Processes may be needed to reduce semiconductor package size and to reduce costs.

BRIEF DESCRIPTION OF THE FIGURES

Some examples of apparatuses and/or methods will be described in the following by way of example only, and with reference to the accompanying figures, in which FIG. 1 shows a flow chart of a method for forming a die interconnect substrate;

FIGS. 2A to 2J show schematic illustrations of a method for forming a die interconnect substrate;

DETAILED DESCRIPTION

Figure 2A:
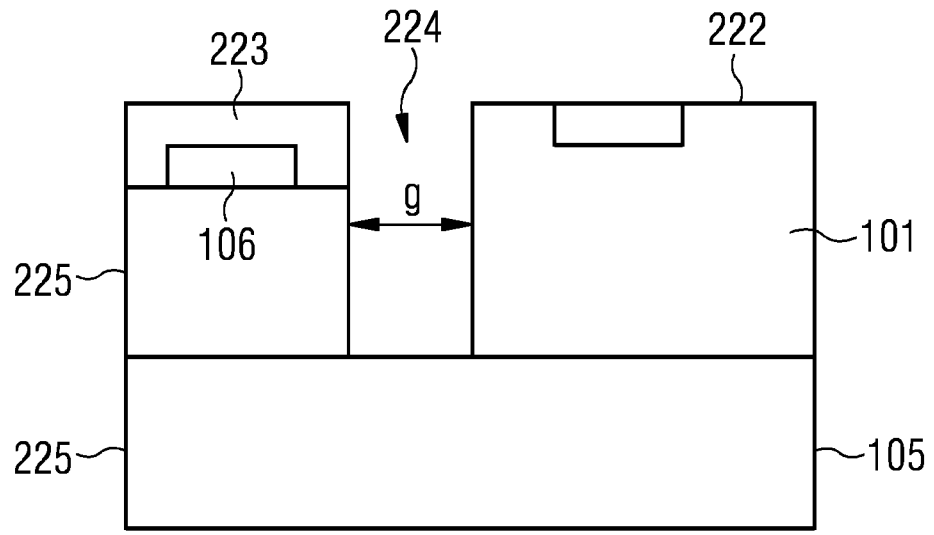

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1 shows a method 100 for forming a die interconnect substrate.

The method 100 comprises placing (in 110) a bridge die in a cavity of a multilayer substrate structure. The bridge die comprises at least one bridge interconnect connecting a first bridge die pad of the bridge die to a second bridge die pad of the bridge die.

The method 100 further comprises forming (in 120) a mask layer on the bridge die.

The method 100 further comprises removing (in 130) portions of the mask layer to form openings exposing at least part of the first bridge die pad and the second bridge die pad by a lithographic process.

The method 100 further comprises forming (in 140) electrically conductive material in the openings of the mask layer to form a via portion on the first bridge die pad.

Due to the forming of the openings in the mask layer by a lithographic process, via portions of smaller width may be formed. Additionally, via portions without aggressive tapering may be formed. This may lead to a reduction in a distance between solder structures (e.g. smaller bump pitch) connected to the via portions. A scaled down (or reduced) bump pitch may lead to smaller semiconductor devices being produced and at lower cost, for example.

Before placing the bridge die in the cavity (and/or before forming the cavity), the multilayer substrate structure may include a plurality of electrically insulating (build-up) layers forming at least part of the multilayer substrate structure. The plurality of electrically insulating (build-up) layers may form an electrically insulating substrate. The electrically insulating substrate may be a polymer-based, epoxy-based and/or laminate based substrate. For example, the electrically insulating substrate may optionally include an electrically insulating core and/or the electrically insulating (dielectric) build-up layers.

The multilayer substrate structure may further include at least part of a substrate interconnect to be formed. The substrate interconnect to be formed may be partially formed before placing the bridge die in the cavity and may be formed (e.g. completely formed) in subsequent processes. The substrate interconnect to be formed may be one of a plurality of substrate interconnects to be formed of the multilayer substrate structure. The substrate interconnect (or each substrate interconnect of the plurality of substrate interconnects) may include a plurality of lateral wiring layers and a plurality of vertical wiring layers arranged alternatingly with respect to each other in a substantially vertical direction. A width of a vertical wiring layer of the substrate interconnect may be larger than (e.g. more than 1.5 times, or e.g. more than 2 times, or e.g. more than 3 times a height of the vertical wiring layer). A maximal (or largest) lateral dimension (e.g. a width) of the vertical wiring layer of the substrate interconnect may be larger than 30 μm (or e.g. larger than 40 μm, or e.g. larger than 45 μm).

Before placing the bridge die in the cavity (and/or before forming the cavity, and/or before forming the via portion), it may be that the substrate interconnect does not extend to a level above the bridge die or above a level of the front surface of the bridge die. For example, the substrate interconnect may extend from a level between the front surface and the bottom surface of the bridge die to a level below the bridge die.

The multilayer substrate structure may be formed by repeatedly alternating between forming a build-up layer and forming lateral wiring layers of the plurality of substrate interconnects and vertical wiring layers of the plurality of substrate interconnects. For example, an electrically insulating build-up layer of the electrically insulating substrate may be formed on (e.g. laminated onto) a substrate core (or on a previous formed lateral wiring layer). The build-up layer may be deposited by vacuum-lamination. For example, the build-up laminate layer may be placed on a surface of the multilayer substrate structure and pressure and heat may be applied to the build-up laminate layer so that the build-up laminate layer adheres to a lateral surface of the multilayer structure. In this way, the build-up laminate layer becomes part of (or becomes connected to) the multilayer substrate structure.

To form a substrate interconnect of the multilayer substrate structure, the method may include forming an opening (or hole) extending substantially vertically through an electrically insulating build-up layer by a laser process (e.g. by laser drilling), and depositing electrically conductive material in the opening to form a vertical wiring layer of a substrate interconnect. The vertical wiring layer of the substrate interconnect may contact or may connect to a previous lateral wiring layer of the substrate interconnect, for example. Vertical wiring layers of the plurality of substrate interconnects located at the same lateral level may be formed by depositing electrically conductive material in the openings simultaneously in the same process.

A lateral wiring layer of the substrate interconnect extending in a substantially lateral (horizontal) direction, may be formed by forming (e.g. depositing) electrically conductive material (e.g. a metal such as copper) on a surface of the electrically insulating substrate. The electrically conductive material may be formed in selected areas of the multilayer substrate structure according to the desired or required wiring layout. For example, after forming (e.g. laser drilling) the opening for a vertical wiring layer of the substrate interconnect in the electrically insulating build-up layer, a semi-additive process (e.g. lithography, plating, seeding and/or etching) may be carried out to form an adjacent lateral wiring layer of the substrate interconnect. The semi-additive process may include forming a mask layer covering the lateral surface of the multilayer substrate structure after forming the opening for the vertical wiring layer of the substrate interconnect in the electrically insulating build-up layer. The semi-additive process may further include forming openings in the mask layer. At least one opening in the mask layer may expose the opening for the vertical wiring layer of the substrate interconnect in the electrically insulating build-up layer. After forming the openings in the mask layer, electrically conductive material may be deposited to form the vertical wiring layer of the substrate interconnect and the lateral wiring layer of the substrate interconnect. For example, the electrically conductive material may be formed in the openings in the mask layer and in the opening in the electrically insulating build-up layer. Lateral wiring layers of the plurality of substrate interconnects located at the same lateral level may be formed simultaneously in the same process. A lateral wiring layer of a substrate interconnect may be connected to a vertical wiring layer of the substrate interconnect at a previous (lower) wiring level and/or to a vertical wiring layer of the substrate interconnect at the next (higher) wiring level.

By repeating the processes of forming a build-up layer, forming a vertical wiring layer of the substrate interconnect and forming a lateral wiring layer of the substrate interconnect, a substrate interconnect which extends vertically through at least part of a multilayer electrically insulating substrate structure may be formed. At least part of the substrate interconnect may be formed by these repetitive process even before forming the cavity.

Before forming the via portion on the first bridge die pad, the multilayer substrate structure may already include a plurality of electrically insulating layers. An uppermost electrically insulating layer of the plurality of electrically insulating layers may form a lateral surface of the multilayer substrate structure next to the cavity. The uppermost electrically insulating layer may cover portions of the substrate interconnect of the multilayer substrate structure, for example.

The method 100 may include forming the cavity at the (front or first) lateral surface of the multilayer substrate structure. The cavity may be formed in at least the uppermost electrically insulating layer (and/or other electrically insulating layers of the multilayer substrate structure) by laser drilling, for example. The cavity may extend from the lateral surface of the multilayer substrate structure to a depth of between 100 μm and 500 μm (or e.g. between 125 μm and 400 μm, or e.g. between 150 μm and 300 μm). Optionally, a depth of the cavity may be substantially equal to a thickness of the bridge die to be placed in the cavity. The method 100 may further include cleaning the cavity after forming the cavity.

The method 100 may include placing 110 the bridge die in the cavity after forming the cavity. After placing the bridge die in the cavity, a front surface of the bridge die and the uppermost electrically insulating layer remaining next to the cavity may form a lateral surface of the multilayer substrate structure. The bridge die may be placed in the cavity so that there is a gap located laterally between a sidewall of the bridge die and a sidewall of the cavity. An average lateral dimension (or width) of the gap may lie between 5 μm and 15 μm (or e.g. between 5 μm and 10 μm). It may be understood that the examples described herein may also relate to gaps which may exist between other sidewalls of the bridge die and the multilayer substrate structure after placing the bridge die in the cavity.

After placing the bridge die in the cavity, the back surface of the bridge die may be in contact with an electrically conductive layer which may be located at the bottom of the cavity of the electrically insulating substrate. The bridge die may not actually form an electrical connection to the electrically conductive layer because the bridge die may not have a backside metallization contact layer. Thus, the bridge die may be physically in contact with a metal plane, but this plane is not part of the wiring on that layer, but merely a base for the bridge die to sit on.

The first bridge die pad and the second bridge die pad of the bridge die may be located at the front surface of the bridge die.

Forming the first via portion and the second via portion may further include forming a continuous seed layer on the surface of the multilayer substrate structure before forming 120 the mask layer on the bridge die. The continuous seed layer may be formed on at least part of the first bridge die pad and the second bridge die pad. Additionally, the continuous seed layer may cover substantially the lateral surface of the multilayer substrate structure. For example, the continuous seed layer may be formed on remaining portions of the uppermost electrically insulating layer, and may line the gap located laterally between the bridge die and the uppermost electrically insulating layer. Additionally, the continuous seed layer may cover the front surface of the bridge die. The continuous seed layer may be formed (or e.g. deposited) by a sputtering process, for example. The continuous seed layer may include copper and/or titanium. For example, the continuous seed layer may be a copper layer, a titanium layer or a copper-titanium layer, for example.

The method 100 comprises forming 120 the mask layer (e.g. depositing and/or laminating photoresist) on at least the bridge die after forming the continuous seed layer. For example, the mask layer may cover (or may be formed on) the lateral surface of the multilayer substrate structure.

The method 100 further comprises removing 130 portions of the mask layer to form openings exposing at least part of the first bridge die pad and the second bridge die pad by a lithographic process. The lithographic process may include at least exposing and developing the mask layer to form the openings in the required areas.

The method 100 further comprises forming electrically conductive material in the openings of the mask layer to form the first via portion on the first bridge die pad and the second via portion on the second bridge die pad. The electrically conductive material may include (or may be) copper or a copper alloy. The electrically conductive material may be formed in the openings of the mask layer by electroplating the electrically conductive material onto the seed layer to form a copper pillar, for example. Each via portion may be part of a bridge contact structure to be formed on a bridge die pad of the bridge die. The bridge contact structure may connect a bridge die pad to a contact interface structure (e.g. a solder structure or e.g. a solder bump) to be formed. Additionally or optionally, the bridge contact structure may include other lateral wiring layers and/or intermediate electrically conductive layers.

The method 100 may include removing the mask layer (e.g. resist stripping) after forming the first via portion and the second via portion (e.g. post plating) Additionally, a laser skiving process may be employed to open fiducials for lithography alignment, for example.

The method 100 may further include removing portions of the continuous seed layer (e.g. by chemical and/or plasma etching) which are not covered by the first via portion and the second via portion, after forming the first via portion and the second via portion. For example, the sputter seed layer may be chemically etched. Additionally or optionally, an adhesion promoter may be applied to the copper prior to the dielectric lamination and cure.

The method 100 may include forming a filler structure filling a gap located laterally between the bridge die and the multilayer substrate structure after forming the via portion. Forming the filler structure may include forming a common electrically insulating layer (e.g. by dielectric lamination) at (or on) the lateral surface of the multilayer substrate structure. Forming the common electrically insulating layer may include placing an electrically insulating laminate layer on the lateral surface of the multilayer structure and applying pressure to the electrically insulating laminate layer so that a portion of the electrically insulating laminate layer is pressed into the gap. For example, the electrically insulating laminate layer may fill the cavity (e.g. the gaps in the cavity laterally surrounding the bridge die). The common electrically insulating layer may cover the lateral surface of the multilayer substrate structure. For example, the common electrically insulating layer may cover the first via portion, the second via portion and the uppermost electrically conductive layer. The common electrically insulating layer may be a dielectric build-up film layer.

The method 100 may further include removing at least part of the common electrically insulating layer until the first via portion and the second via portion are exposed (e.g. revealed. For example, the method may include planarizing a surface to expose (or e.g. reveal) the first via portion and the second via portion after forming the common electrically insulating layer. The surface may be a front lateral surface of the common electrically insulating layer (and/or the multilayer substrate structure), for example. Removing at least part of the electrically insulating filler layer may be carried out using a dielectric etch back process to expose the lithographically defined vias. The dielectric etch back process may include at least one of chemical etching, planarization (e.g. mechanical planarizing and/or polishing), sand blasting plasma etching and mechanical grinding, for example.

Alternatively, instead of the filler structure being formed by (or from) an electrically insulating laminate layer, the filler structure may be an electrically conductive filler structure. For example, after forming the seed layer, the method may include forming electrically conductive material (e.g. by electroplating) to form the via portion and the electrically conductive filler structure in the same process. For example, simultaneous copper filling and pillar plating may be carried out, so that the copper may be plated to fill the gap between the bridge die and the cavity sidewall. This may stabilize the bridge die, prevent dielectric-to-bridge die delamination, and/or avoiding resist tenting over the die-to-cavity gap. On the other hand, having an electrically insulating filler structure (such as using the dielectric build-up film layer) may avoid the CTE mismatch between copper and silicon which may place higher stress on the silicon. After forming the electrically conductive filler structure, the common electrically insulating layer may be formed on the surface of the multilayer substrate structure covering the first via portion, the second via portion, the electrically conductive filler structure and the uppermost electrically conductive layer, for example.

The method 100 may further include forming a first vertical wiring layer of the substrate interconnect after forming the first via portion and the second via portion (e.g. after forming the common electrically insulating layer and/or after planarizing the surface to expose the first via portion and the second via portion). Forming the first vertical wiring layer of the substrate interconnect may include forming an opening in the uppermost electrically insulating layer and/or the common electrically insulating layer of the multilayer substrate structure to expose at least part of the substrate interconnect by a laser process (e.g. using a $CO_2$ laser). For example, the opening may be formed by using laser drilling to from an opening in the uppermost electrically insulating layer and the common electrically insulating layer. For example, the laser may be used to drill microvias outside the bridge die region. The laser process for forming the first vertical wiring layer of the substrate interconnect may be the last laser process for forming openings for the formation of vertical wiring layers of the substrate interconnect, for example. Additionally or optionally, a desmear process may be carried out after forming the opening to clean the opening, for example. Optionally or alternatively, a reactive ion etch RIE process and/or capacitively coupled plasma CCP etching process may be used for cleaning the laser drilled vias.

A maximal (or largest) lateral dimension (e.g. width) of the opening in the uppermost electrically insulating layer and the common electrically insulating layer may be at least 1.5 times (or e.g. at least 2 times, or e.g. at least 3 times, or e.g. at least 5 times, or e.g. at least 10 times) the maximal lateral dimension of the first via portion 107. Additionally, the sidewalls of the opening in the uppermost electrically insulating layer and the common electrically insulating layer may be tapered. For example, an average angle between a lateral surface of an electrically insulating build-up layer of the multilayer structure and a sidewall of the opening in the uppermost electrically insulating layer and the common electrically insulating layer may be less than 80° (or e.g. less than 75°, or e.g. less than 70°).

The method 100 may further include simultaneously forming a first lateral wiring layer of the substrate interconnect and a first lateral wiring layer of the bridge contact structure after forming the opening in the uppermost electrically insulating layer and the common electrically insulating layer. The first lateral wiring layer of the substrate interconnect and the first lateral wiring layer of the bridge contact structure may be located at the same layer level in the multilayer substrate structure, for example. Optionally, the first vertical wiring layer of the substrate interconnect, first lateral wiring layer of the substrate interconnect and the first lateral wiring layer of the bridge contact structure may be formed using a semi-additive process SAP for via fill and pattern plating (e.g. fabricate pads and traces). For example, the method 100 may include forming a mask layer covering the lateral surface of the multilayer substrate structure after forming the opening by the laser process. The method 100 may include forming openings in the mask layer to expose the opening in the uppermost electrically insulating layer and the common electrically insulating layer, and at least the first via portion and the second via portion by a lithographic process. The method 100 may further include forming (or e.g. depositing) electrically conductive material in the openings of the mask layer to form the first vertical wiring layer of the substrate interconnect, the first lateral wiring layer of the substrate interconnect and the first lateral wiring layer of the bridge contact structure in the same process. Due to the positioning of the openings of the mask layer, electrically conductive material may also be formed in the opening of the uppermost electrically insulating layer and the common electrically insulating layer to form the first vertical wiring layer of the substrate interconnect. The electrically conductive material may be deposited by electroplating, for example.

The method 100 may further include simultaneously forming a first contact interface structure and a second contact interface structure (first level interconnect FLI structures) after forming the first via portion, the second via portion and the first vertical wiring layer of the substrate interconnect. The first contact interface structure and the second contact interface structure may each be part of a solder bump structure for providing an ohmic or electrical contact to a semiconductor die or semiconductor device. For example, the first contact interface structure and the second contact interface structure may each be configured for attaching a semiconductor die to the multilayer substrate structure via a controlled collapse chip connection C4 (e.g. a flip chip connection).

Each contact interface structure may be connected to a bridge die pad via a bridge contact structure. For example, the first contact interface structure may be connected to the first bridge die pad via a first bridge contact structure. The second contact interface structure may be connected to the substrate interconnect, for example.

Forming the first contact interface structure and the second contact interface structure may include forming (e.g. laminating or e.g. depositing) a solder resist mask layer at a lateral surface of the multilayer substrate structure and removing portions of the solder resist mask layer to form openings exposing the substrate interconnect and the bridge contact structure by a HR lithographic process (for the exposure and development of the openings). Forming the first contact interface structure and the second contact interface structure may further include forming (e.g. depositing) electrically conductive material in the openings of the mask layer to form the first contact interface structure and the second contact interface structure. Additionally or optionally, the first contact interface structure and the second contact interface structure may be formed using a semi-additive process SAP for via fill and bump plating. Both the first contact interface structure and the second contact interface structure may protrude from (or may be exposed at) the front surface of the multilayer substrate structure. The method 100 may further include depositing a surface finish layer (e.g. NiPdAu) at the lateral surface of the first contact interface structure and at the lateral surface of the second contact interface structure.

The method 100 may further include attaching (by soldering) a semiconductor device to the first bridge die pad of the bridge die. Additionally, the method may further include attaching a second semiconductor device to the second bridge die pad of the bridge die. The multilayer substrate structure may be attached (or e.g. soldered to) the first semiconductor device via the first contact interface structure and the second contact interface structure. Thus, the first semiconductor device may be attached (or connected) to the first bridge die via the first contact interface structure. Optionally, the first contact interface structure and the second contact interface structure may be attached to the same semiconductor device. Additionally, the second semiconductor device may be attached to the second bridge die pad via an interface structure connected to the second bridge die pad.

Embedded interconnect bridge (EMIB) processes may be used for multi-chip packaging (MCP) technology. In EMIB, die to die connections may be realized by embedding the bridge die into an organic substrate. The bridge die may be fabricated with silicon back end of line technology, enabling miniaturization of the trace and pad size to 2 µm. These tight dimensions may increase the routing density of a substrate by an order of magnitude (~250 IO/mm). Laser drilling may be used to form vias as vertical interconnects between the substrate layers and the embedded silicon bridge. However, laser drilling alignment capabilities may limit the die bump pitch to 55 µm, for example. In laser drilling, the vias may be drilled one via at a time, moving the laser beam with a galvanometer. Laser drilling may cope with the shot to shot variation induced by this moving beam and to a first approximation this means that laser variation may be higher than that of a mask based lithography process. Laser drilled vias also suffer from via enlargement due to the via cleaning process (desmear) that may etch the dielectric. As such, devices may be limited to a 55 µm bump pitch with 50 µm bridge landing pad and 23 µm vias, for example.

The examples described herein may form lithographically defined copper vias/pillars as vertical interconnects, which may lead to a tighter and reduced die bump pitch of 40 µm, for example. Lithographically defined pillars may have better layer-to-layer alignment, since pillars may be electroplated in the resist openings which may be exposed and developed at once (e.g. simultaneously). High resolution exposure tools may achieve ±6.5 µm alignment on an organic panel. Additionally, no via enlargement effect may be present as the desmear process in laser drilling technology may be avoided. Hence lithographically defined copper pillars enable scaling bump pitch down to 40 µm or lower. For example, less than 30 µm wide bridge pads may be fabricated, allowing for 6.5 µm alignment and less than 17 µm wide vias. For example, lateral dimensions of 9×18 µm in copper pillars may be achieved.

FIGS. 2A to 2F show schematic illustrations of a method 200 for forming a die interconnect substrate. The method 200 may be a lithography defined via process flow.

As shown in FIG. 2A, the method 200 may include placing the bridge die 101 in a cavity (e.g. mounting the bridge die in the substrate cavity) after forming the cavity. The cavity may be formed in at least the uppermost electrically insulating layer (and/or other electrically insulating layers of the multilayer substrate structure) by laser drilling, for example. The cavity may be fabricated through one dielectric layer, or through multiple layers depending on the design. Optionally, a depth of the cavity may be substantially equal to a thickness of the bridge die to be placed in the cavity.

Before placing the bridge die in the cavity (and/or before forming the cavity), the multilayer substrate structure may include a plurality of electrically insulating (build-up) layers 225 forming at least part of an electrically insulating substrate. The build-up layers may be dielectric build-up film layers, for example.

The multilayer substrate structure 105 may further include at least part of a substrate interconnect 106 to be formed. Before placing the bridge die in the cavity (and/or before forming the cavity, and/or before forming the via portion), it may be that the substrate interconnect 106 does not extend to a level above the bridge die 101 or above a level of the front surface 222 of the bridge die 101.

The bridge die 101 may be placed in the cavity so that there is a gap 224 located laterally between a sidewall of the bridge die and a sidewall of the cavity. An average lateral dimension (or width) of the gap, g, may lie between 5 µm and 15 µm (or e.g. between 5 µm and 10 µm).

After placing the bridge die 101 in the cavity (e.g. after die bonding), a front surface 222 of the bridge die 101 and the uppermost electrically insulating layer 223 remaining next to the cavity may form a lateral surface of the multilayer substrate structure 105. For example, the front surface 222 of the bridge die 101 and the uppermost electrically insulating layer 223 may be substantially level with each other.

Figure 2B:
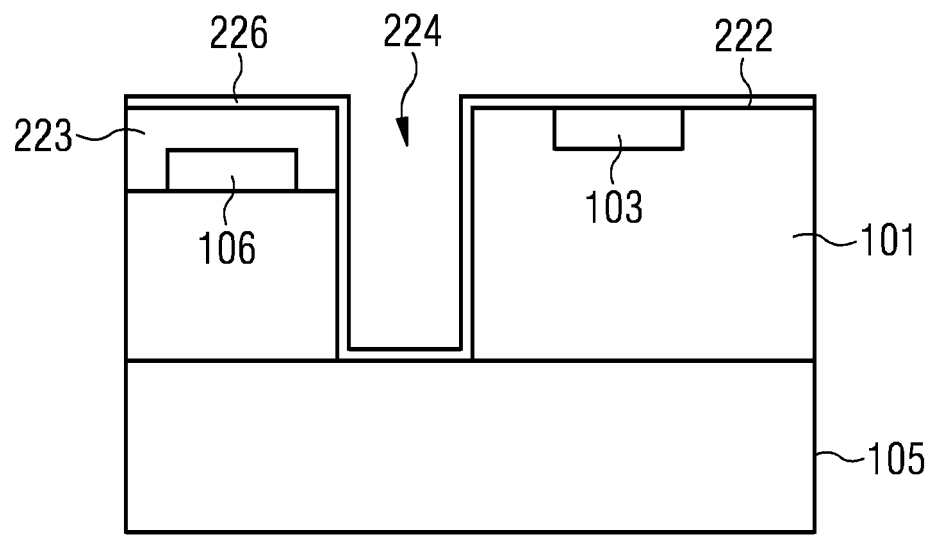

As shown in FIG. 2B, forming the via portion may further include forming a continuous seed layer 226 on the surface of the multilayer substrate structure 105 (e.g. after die bonding). The continuous seed layer 226 may be formed on at least part of the first bridge die pad 103 and the second bridge die pad. Additionally, the continuous seed layer 226 may substantially cover the surface of the multilayer substrate structure. For example, the continuous seed layer 226 may be formed on remaining portions of the uppermost electrically insulating layer 223, and may line the gap 224 located laterally between the bridge die 101 and the uppermost electrically insulating layer 223. For example, the continuous seed layer 226 may be formed at on the sidewalls of the cavity, the sidewalls of the bridge die 101, and at the bottom of the gap 224. Additionally, the continuous seed layer may cover a front surface 222 of the bridge die 101. The continuous seed layer 226 may be formed (or e.g. deposited) by a sputtering process which may adhere (or stick) better to the smooth silicon bridge surface than electroless copper, for example. Thus, in place of electroless copper, a sputtered seed layer (e.g. Ti/Cu) may be used on the bridge die for strong adhesion. The continuous seed layer may include copper and/or titanium. For example, the continuous seed layer may be a copper layer, a titanium layer or a copper-titanium layer. Optionally, the sputtered seed layer may be a copper alloy.

The method 200 may further include forming a mask layer (e.g. depositing photoresist) on at least the bridge die 101 after forming the continuous seed layer 226. The mask layer may substantially cover the lateral surface of the multilayer substrate structure. For example, the mask layer may cover the front surface 222 of the bridge die 101, the uppermost electrically insulating layer 223, and may fill the gap 224 located laterally between the bridge die 101 and the uppermost electrically insulating layer 223.

The method 200 may include removing portions of the mask layer to form openings exposing at least part of the first bridge die pad 103 and the second bridge die pad by a lithographic process. The lithographic process may include at least exposing and developing the mask layer to form the openings in the required areas.

Figure 2C:
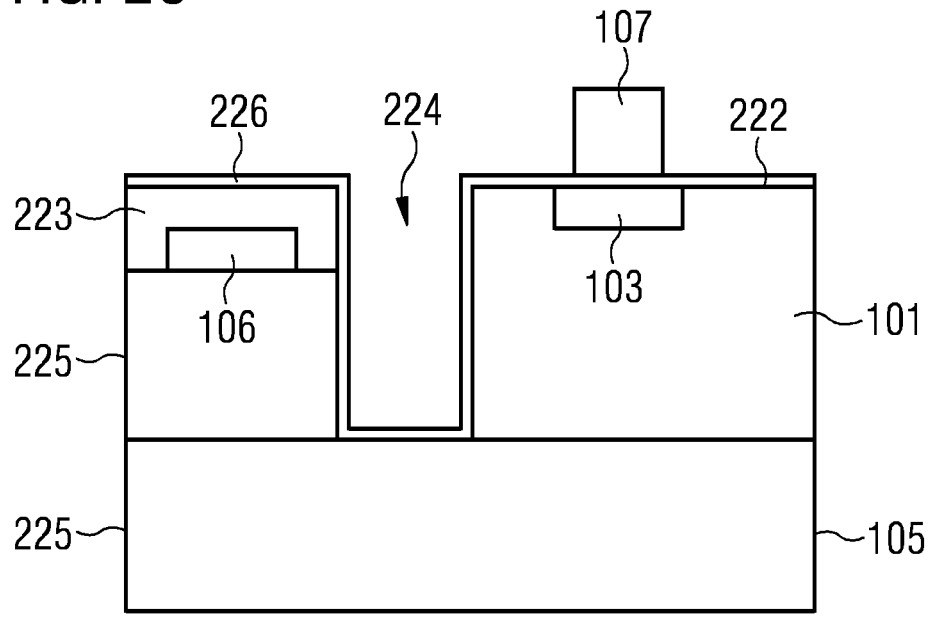

As shown in FIG. 2C, the method 200 may include forming electrically conductive material in the openings of the mask layer to form the first via portion 107 on the first bridge die pad 103 and the second via portion on the second bridge die pad. The electrically conductive material may include (or be) copper or a copper alloy. The electrically conductive material may be formed in the openings of the mask layer by electroplating the electrically conductive material onto the seed layer to form a copper pillar, for example. For example, the lithographic vias may be plated. Each via portion may be part of a bridge contact structure to be formed on a bridge die pad of the bridge die. The bridge contact structure may connect a bridge die pad to a contact interface structure (e.g. a solder structure or e.g. a solder bump) to be formed.

The method 200 may include removing the mask layer (e.g. resist stripping) after forming the first via portion 107 and the second via portion.

Figure 2D:
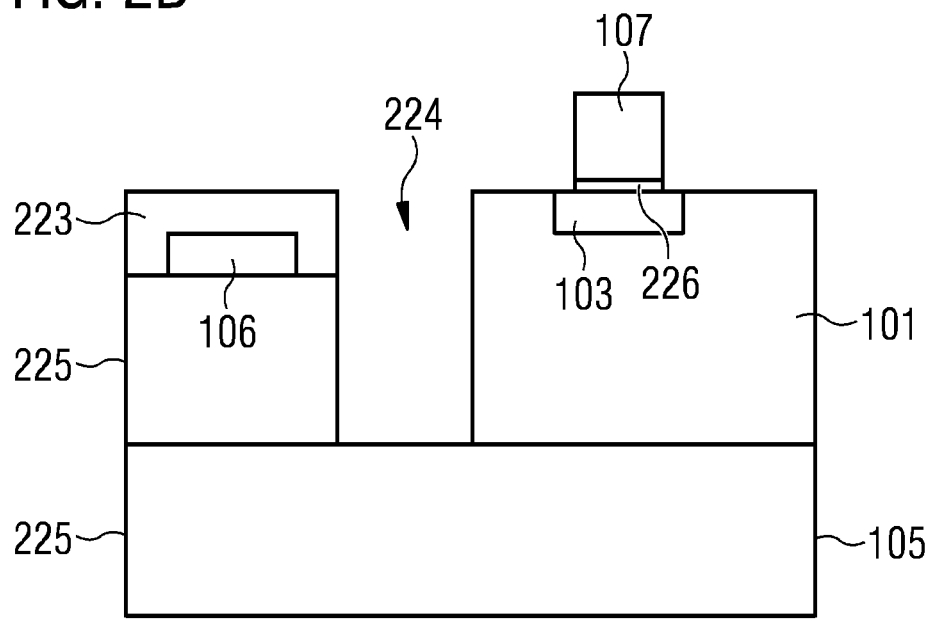

As shown in FIG. 2D, the method 200 may further include removing portions of the continuous seed layer (e.g. by chemical and/or plasma etching) which are not covered by the first via portion 107 and the second via portion, after forming the first via portion 107 and the second via portion.

Figure 2E:
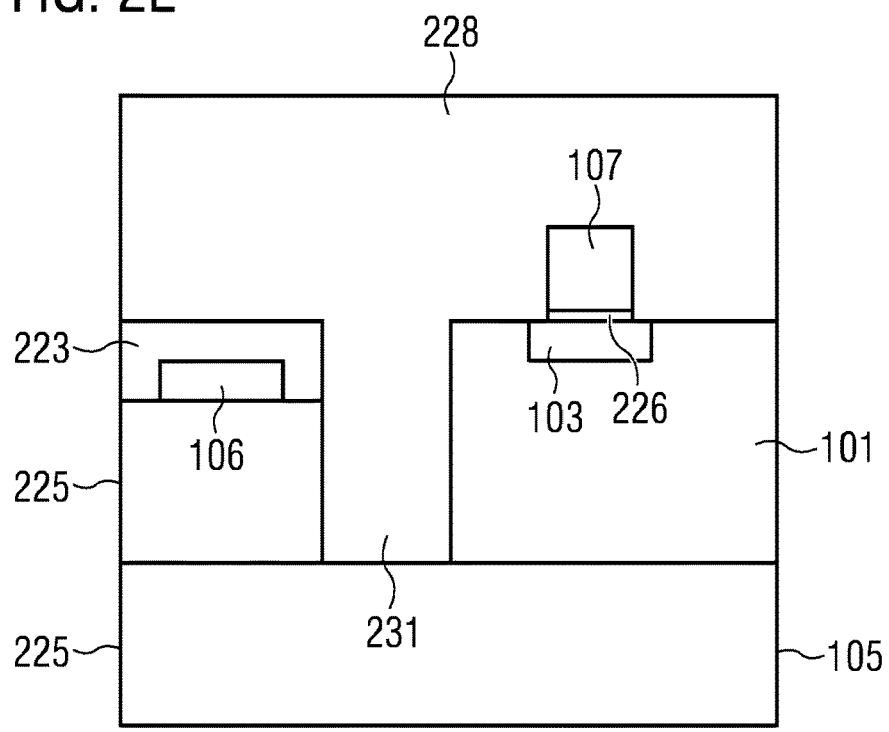

As shown in FIG. 2E, the method 200 may include forming a filler structure 231 filling the gap 224 located laterally between the bridge die 101 and the multilayer substrate structure 105 after forming the first via portion 107 and the second via portion. Forming the filler structure 231 may include forming a common electrically insulating layer 228 (e.g. by dielectric lamination) at the lateral surface of the multilayer substrate structure 105. Forming the common electrically insulating layer 228 may include placing the electrically insulating laminate layer on the lateral surface of the multilayer structure 105 and applying pressure to the electrically insulating laminate layer so that a portion of the electrically insulating laminate layer is pressed into the gap 224. For example, the electrically insulating laminate layer may fill the cavity (e.g. the gaps in the cavity laterally surrounding the bridge die). The common electrically insulating layer 228 may cover the lateral surface of the multilayer substrate structure. For example, the common electrically insulating layer 228 may cover the first via portion 107, the second via portion and the uppermost electrically conductive layer 223. The common electrically insulating layer 228 may be a dielectric build-up film layer (e.g. the same material as the uppermost electrically insulating layer 223 and the plurality of electrically insulating layers of the multilayer substrate structure 105).

Figure 2F:
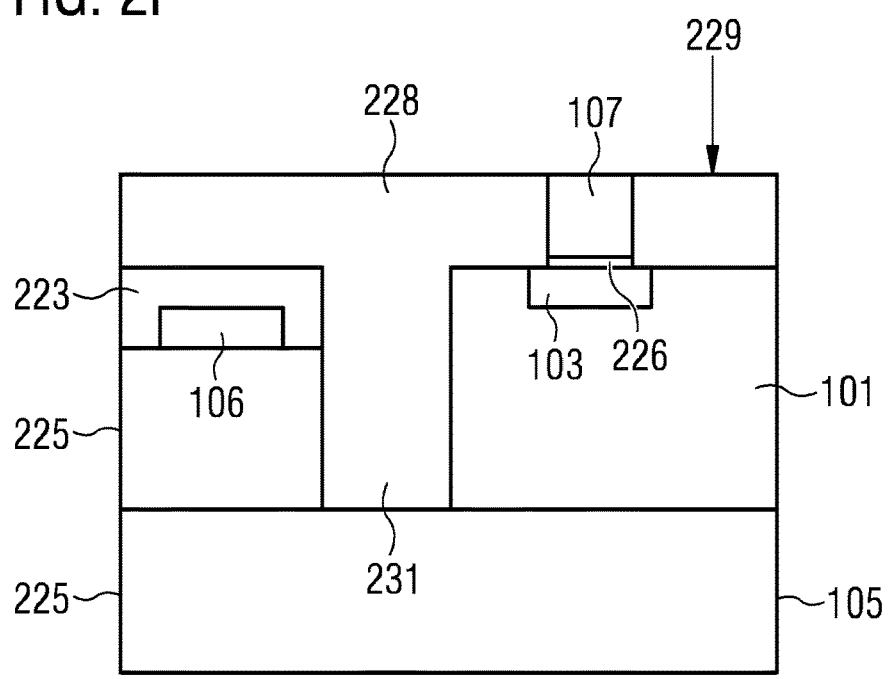

As shown in FIG. 2F, the method 200 may further include removing at least part of the common electrically insulating layer 228 until the first via portion 107 and the second via portion are exposed. For example, the method may include planarizing a surface 229 to expose (or e.g. reveal) the first via portion 107 and the second via portion after forming the common electrically insulating layer 228. The surface may be a front lateral surface 229 of the common electrically insulating layer 228 (and/or the multilayer substrate structure 105), for example. Removing at least part of the common electrically insulating layer 228 may be carried out using a dielectric etch back process. The dielectric etch back process may include at least one of chemical etching, planarization (e.g. planarizing), plasma etching and mechanical grinding, for example. Additionally or optionally, RIE/CCP plasma etching may be used for the via reveal process. Since copper does not form volatile species with the etching species present in the plasma (F and 0 radicals), plasma etching may be highly selective to the dielectric material. For example, plasma etching may be selective to epoxy and does not significantly etch Cu. This may lead to dielectric over-etch. However, the process time may be controlled to achieve minimal protrusion. For example, only about 300 nm copper protrusion over the dielectric build-up film layer may be achieved.

As shown in FIG. 2G, the method 200 may further include forming a first vertical wiring layer of the substrate interconnect 106 after forming the first via portion 107 and the second via portion (and/or after planarizing the surface to expose the first via portion 107 and the second via portion).

Forming the first vertical wiring layer of the substrate interconnect may include forming (as shown in FIG. 2G) an opening 232 in the uppermost electrically insulating layer 223 and/or the common electrically insulating layer 228 of the multilayer substrate structure 105 to expose at least part of the substrate interconnect 106 by a laser process. For example, the opening 232 may be formed by using laser drilling to from the opening 232 in the uppermost electrically insulating layer 223 and the common electrically insulating layer 228. Additionally or optionally, a desmear process may be carried out after forming the opening to clean the opening, for example.

As shown in FIG. 2H, the method 200 may further include simultaneously forming a first lateral wiring layer 233 of the substrate interconnect 106 and a first lateral wiring layer 234 of the bridge contact structure 235. The first lateral wiring layer 233 of the substrate interconnect 106 and the first lateral wiring layer 234 of the bridge contact structure 235 may be located at the same layer level in the multilayer substrate structure 105, for example.

Additionally, the first vertical wiring layer 236 of the substrate interconnect 106, the first lateral wiring layer 233 of the substrate interconnect 106 and the first lateral wiring layer 234 of the bridge contact structure 235 may be formed (simultaneously) using a semi-additive process SAP for via fill and pattern plating. For example, the method 200 may include forming a mask layer covering the lateral surface of the multilayer substrate structure 105 after forming the opening 232 in the uppermost electrically insulating layer and the common electrically insulating layer 223 by the laser process. The method 200 may include forming openings in the mask layer to expose the opening 232 in the uppermost electrically insulating layer and the common electrically insulating layer 223, and at least the first via portion 107 and the second via portion by a lithographic process. The method 100 may further include forming (or e.g. depositing) electrically conductive material in the openings of the mask layer to form the first vertical wiring layer 236 of the substrate interconnect 106 in the opening 232, the first lateral wiring layer 233 of the substrate interconnect 106 and the first lateral wiring layer 234 of the bridge contact structure 235 in the same process. The electrically conductive material (e.g. copper or a copper alloy) may be deposited by electroplating, for example.

Figure 2I:
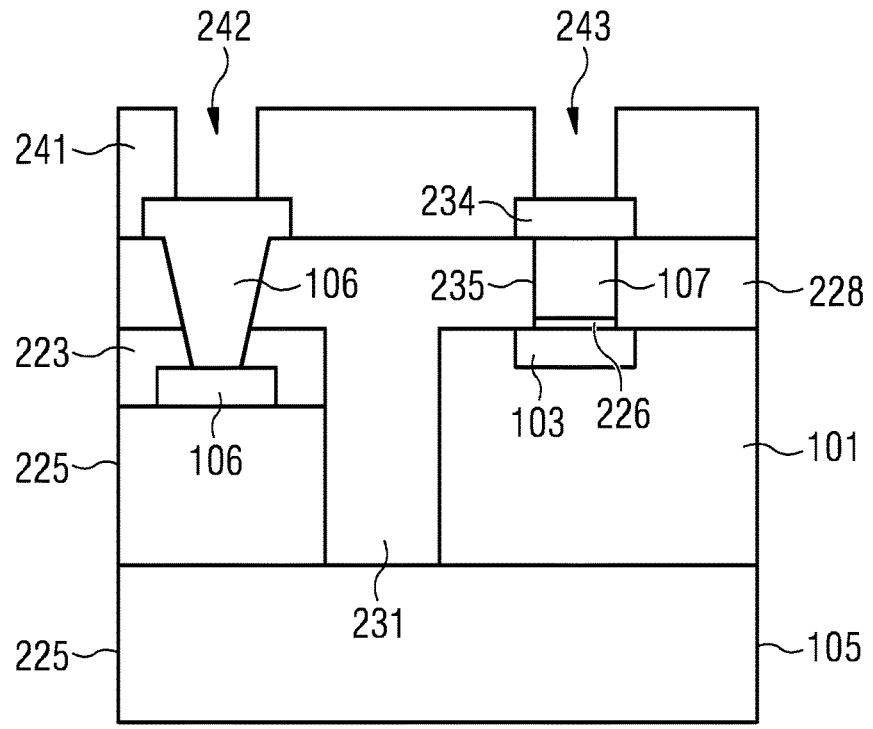
Figure 2J:
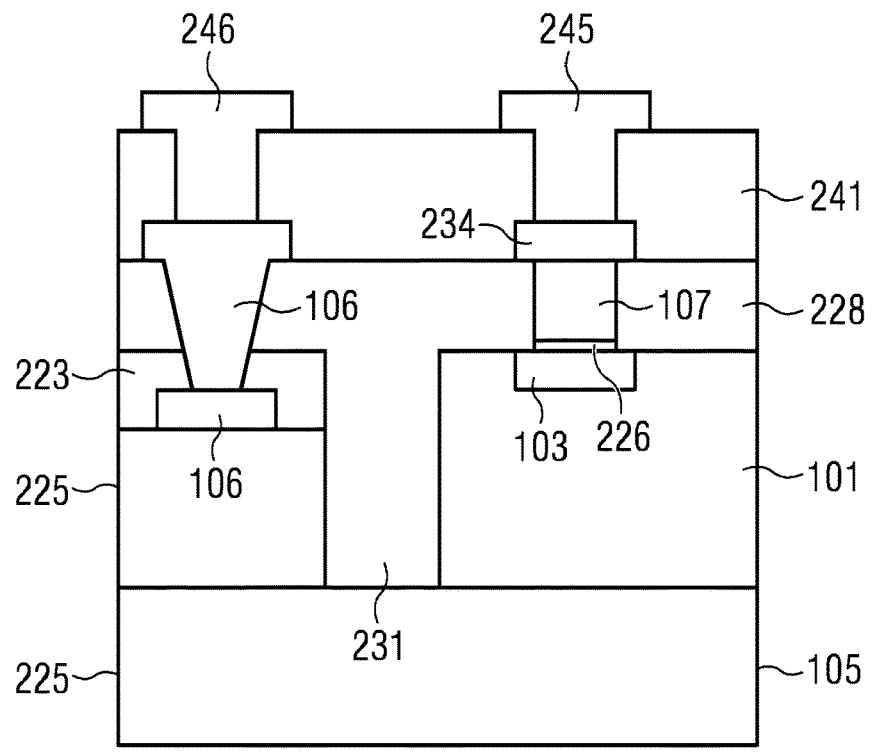

As shown in FIGS. 2I and 2J, the method 200 may further include simultaneously forming a first contact interface structure 245 and a second contact interface structure 246 (first level interconnect FLI structures) after forming the first lateral wiring layer 233 of the substrate interconnect 106, the first lateral wiring layer 234 of the bridge contact structure 235 and the first vertical wiring layer 236 of the substrate interconnect 106.

As shown in FIG. 2I, forming the first contact interface structure 245 and the second contact interface structure 246 may include forming (e.g. laminating or e.g. depositing) a solder resist mask layer 241 at a lateral surface of the multilayer substrate structure 105 and removing portions of the solder resist mask layer 241 to form openings 242, 243 exposing the substrate interconnect 106 and the bridge contact structure 235 by a HR lithographic process and/or HR exposure tool (for the exposure and development to open the solder resist openings).

As shown in FIG. 2J, forming the first contact interface structure 245 and the second contact interface structure 246 may further include forming (e.g. depositing) electrically conductive material in the openings 242, 243 of the mask layer 241 to form the first contact interface structure 245 and the second contact interface structure 246. The first contact interface structure 245 and the second contact interface structure 246 may be copper pillars, acting as microbumps for die attach. Additionally or optionally, the first contact interface structure 245 and the second contact interface 246 structure may be formed using a semi-additive process SAP for via fill and bump plating. Both the first contact interface structure 245 and the second contact interface structure 246 may protrude from (or may be exposed at) the front surface of the multilayer substrate structure. The method 100 may further include depositing a surface finish layer (e.g. NiPdAu) at the lateral surface of the first contact interface structure and at the lateral surface of the second contact interface structure.

The method 200 may further include attaching (by soldering) a first semiconductor device to the first bridge die pad of the bridge die. Additionally, the method may further include attaching a second semiconductor device to the second bridge die pad of the bridge die. The multilayer substrate structure 105 may be attached (or e.g. soldered to) the first semiconductor device via the first contact interface structure 245 and the second contact interface structure 246. Thus, the first semiconductor device may be attached (or connected) to the first bridge die 103 via the first contact interface structure 245. Optionally, the first contact interface structure 245 and the second contact interface structure 246 may be attached to the same semiconductor device. Additionally, the second semiconductor device may be attached to the second bridge die pad via an interface structure connected to the second bridge die pad.

Figure 4:
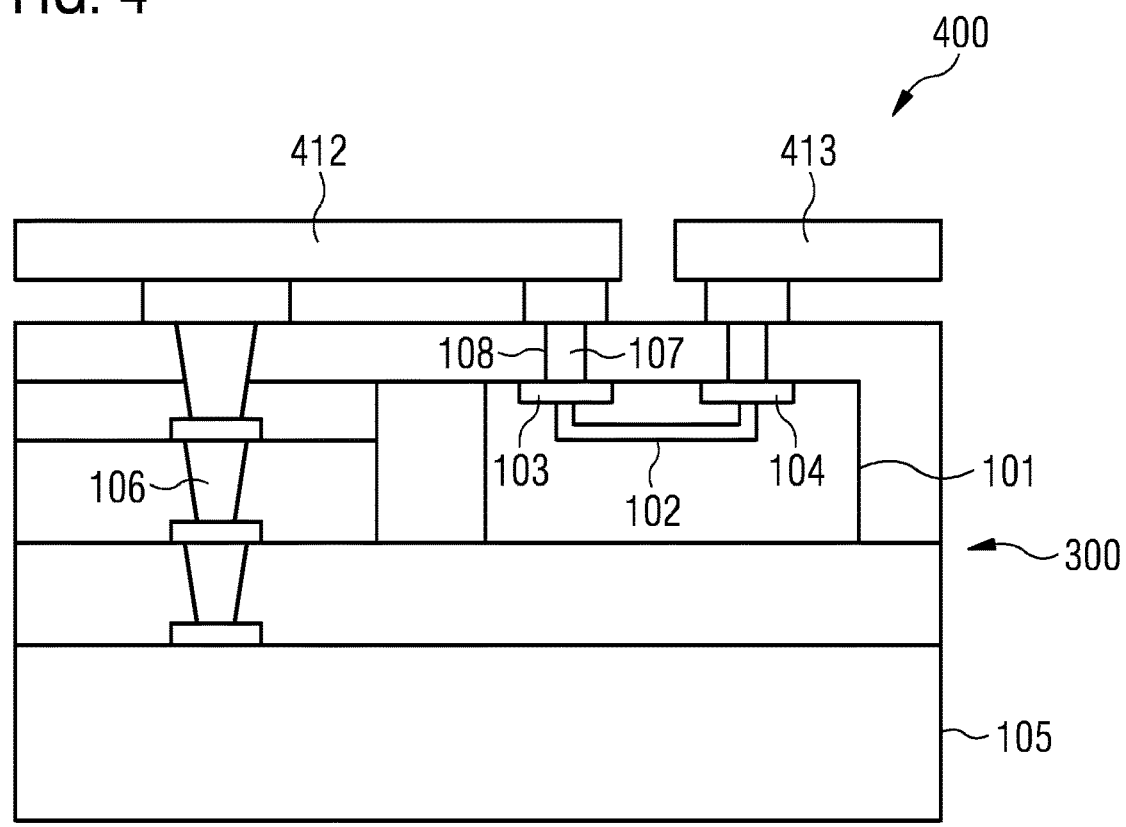
FIG. 4 shows a schematic illustration of an electrical device.
Figure 5:
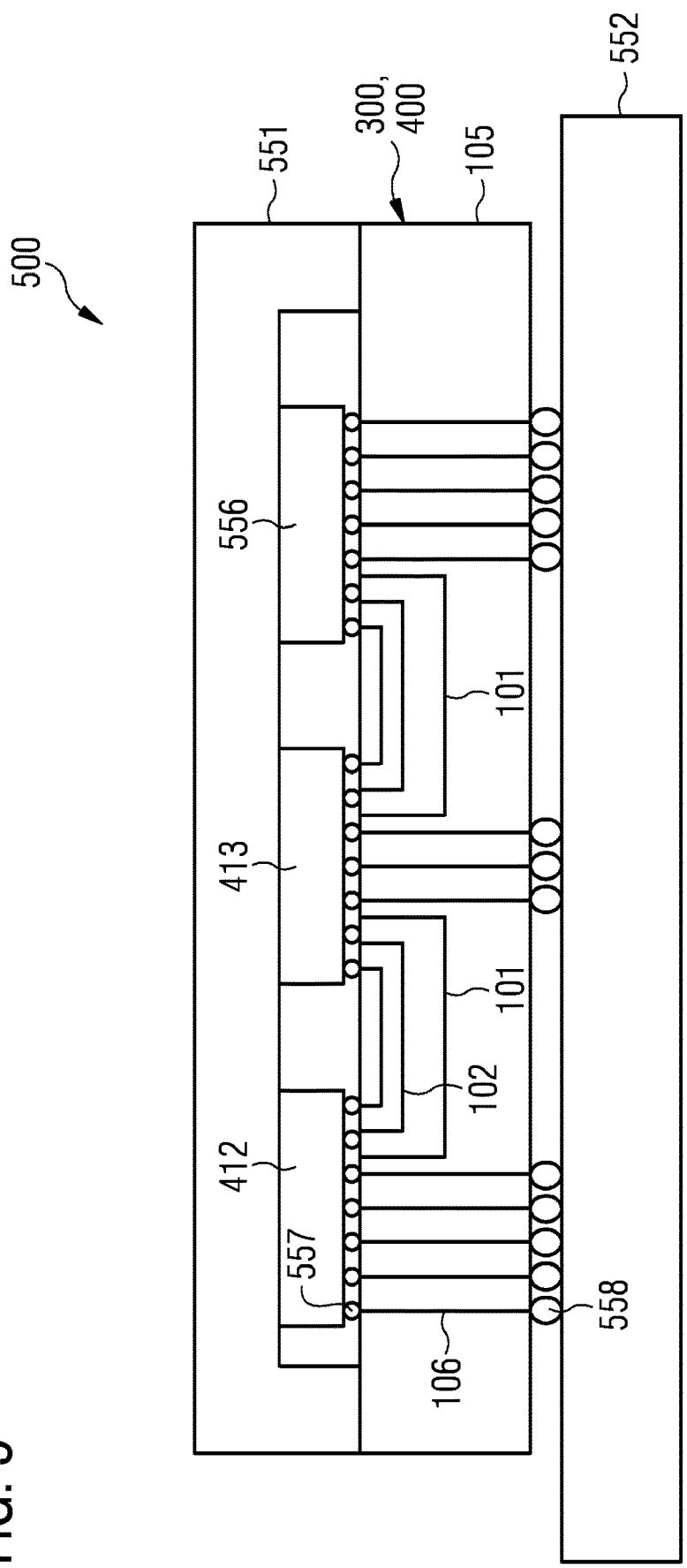
FIG. 5 shows a schematic illustration of a semiconductor package comprising the die interconnect substrate.

More details and aspects are mentioned in connection with the examples described above or below. The examples shown in FIGS. 2A to 2J may each comprise one or more optional additional features corresponding to one or more aspects mentioned in connection with the proposed concept or one or more examples described above (e.g. FIG. 1) or below (FIGS. 3 to 5).

Figure 3:
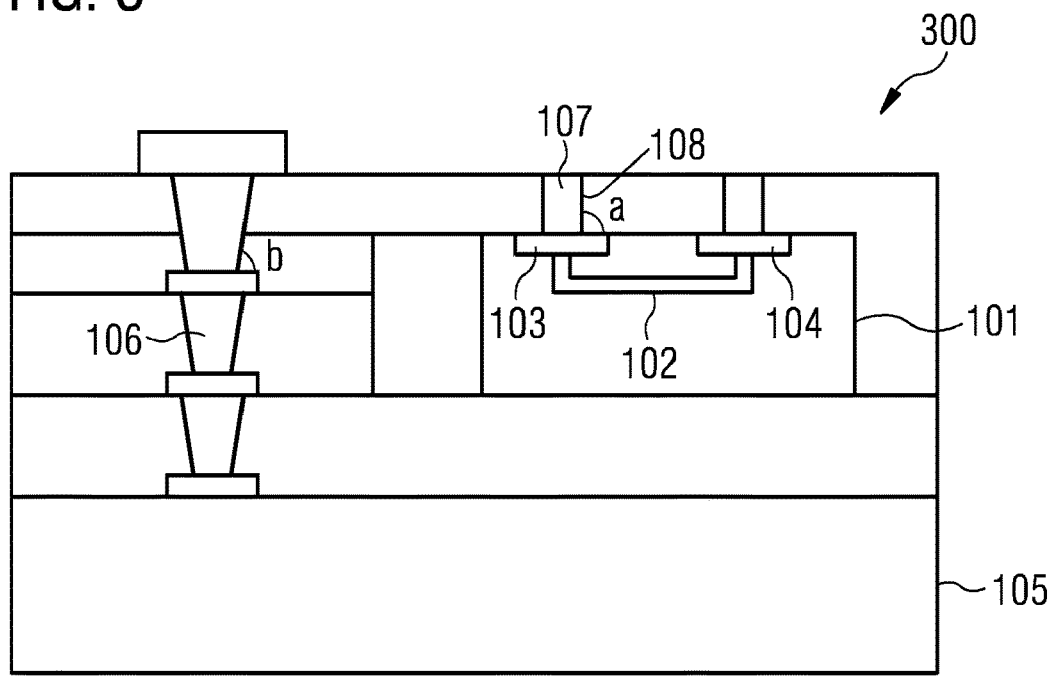
FIG. 3 shows a schematic illustration of a die interconnect substrate.

FIG. 3 shows a schematic illustration of at least part of a die interconnect substrate 300.

The die interconnect substrate 300 comprises a bridge die 101 comprising at least one bridge interconnect 102 connecting a first bridge die pad 103 of the bridge die 101 to a second bridge die pad 104 of the bridge die 101.

The die interconnect substrate 300 further comprises a multilayer substrate structure 105 comprising a substrate interconnect 106. The bridge die 101 is embedded in the multilayer substrate structure 105.

The die interconnect substrate 300 further comprises a via portion 107 formed on the first bridge die pad 103 of the bridge die 101.

An average angle, a, between a surface of the first bridge die pad 103 and a sidewall 108 of the via portion lies between 85° and 95°.

Due to the average angle between the surface of the first bridge die pad 103 and the sidewall 108 of the via portion lying between 85° and 95°, enlarged via portions (e.g. cone shaped via portions) may be avoided. This may lead to a reduction in a distance between solder structures (e.g. smaller bump pitch) connected to the via portions. A scaled down (or reduced) bump pitch may lead to smaller semiconductor devices being produced and at lower cost, for example.

A maximal (or largest) lateral dimension (e.g. width), of the first via portion 107 may lie between 3 µm and 20 µm (or e.g. between 5 µm and 15 µm, or e.g. less than 10 µm), for example. Additionally, very little to almost no tapering (e.g. almost zero sidewall tapering) may exist in the sidewalls of the via portion 107. For example, the sidewalls of the via portion 107 may be substantially vertical. The average angle, a, between a (lateral) surface of the bridge die pad and a sidewall 108 of the via portion 107 may lie between 85° and 95° (or e.g. between 87° and 93°). The average angle may be an angle measured between the sidewall 108 of the via portion and the bridge die pad 103 over more than 80% (or e.g. more than 90%, or e.g. more than 95%, or e.g. more than 99%) of the sidewall 108 of the via portion 107. Additionally or optionally, an average angle between the sidewall 108 of the via portion 107 and the lateral surface of the substrate die (of the bridge die 101) may lie between 85° and 95° (or e.g. between 87° and 93°). For example, the sidewall 108 of the via portion 107 may be (substantially) perpendicular to the surface of the first bridge die pad.

Additionally or optionally, a lateral dimension (or width) of the first via portion 107 directly adjacent to (or directly above) the first bridge die pad 103 may be substantially equal to a lateral dimension of the first via portion 107 throughout the first via portion 107. For example, a lateral dimension of the first via portion 107 (e.g. of more than 80%, or e.g. more than 90%, or e.g. more than 95%, or e.g. more than 99%) of the first via portion 107 varies from the lateral dimension of the first via portion 107 directly adjacent to the first bridge die pad 103 by less than 5% (or e.g. less than 3%, or e.g. less than 1%).

The first via portion 107 may include a seed layer and electrically conductive material formed on the seed layer, for example. The seed layer may be a copper layer, a titanium layer or a copper-titanium layer, for example. The electrically conductive material may include copper (e.g. electroplated copper) or a copper alloy.

The bridge die 101 may be an embedded multi-die interconnect bridge (EMIB) die. For example, the bridge die 101 may provide one or more electrical interconnections between multiple semiconductor devices (See FIG. 4). The bridge die 101 may include a plurality of bridge die pads 103, 104 and a plurality of bridge interconnects 102. Additionally or optionally, the first bridge die pad 103 may be one bridge die pad 103 of first group (or plurality) of bridge die pads of all the bridge die pads of the bridge die 101. The first group of bridge die pads may be located within a first lateral region of the bridge die 101. The first group of bridge die pads may each be ohmically or electrically connected to the same (first) semiconductor device via interface structures individually ohmically or electrically connected to each bridge die pad of the first group of bridge die pads. The second bridge die pad 104 may be one bridge die pad 104 of second group (or plurality) of bridge die pads of all the bridge die pads of the bridge die 101. The second group of bridge die pads may be located within a second lateral region of the bridge die 101 which is different from the first lateral region of the bridge die 101. The second group of bridge die pads may each be ohmically or electrically connected to the same (second) semiconductor device via interface structures individually connected to each bridge die pad of the second group of bridge die pads.

A maximal lateral dimension (or width) of a bridge die pad (e.g. the first bridge die pad 103, or e.g. the second bridge die pad 104) may lie between 20 µm and 40 µm (or e.g. between 20 µm and 35 µm, or e.g. between 25 µm and 35 µm, or e.g. may be less than 40 µm), for example.

Each bridge interconnect 102 may provide a route for an electrical signal. One bridge interconnect 102 may connect a first bridge die pad 103 of the first group of bridge die pads to a second bridge die pad 104 of the second group of bridge die pads. Since the first bridge die pad 103 may be connected to a first semiconductor device via a first contact interface structure, and the second bridge die pad 104 may be connected to a second semiconductor device via a second contact interface structure, the bridge interconnect 102 may provide a route for an electrical signal between the first semiconductor device and the second semiconductor device. Additionally or optionally, one or more further bridge interconnects 102 may each be configured to provide an electrical route between another bridge die pad of the first group of bridge die pads to another bridge die pad of the second group of bridge die pads. Additionally or optionally, at least one other bridge interconnect 102 may be configured to provide a route for an electrical signal from a bridge die pad to a substrate interconnect 106 of the multilayer substrate structure 105. Since the bridge interconnects of the bridge die may provide an electrical route between a first semiconductor die and a second semiconductor die, the die interconnect substrate may be referred to as a die-to-die interconnect substrate.

The bridge die 101 may be embedded in the multilayer substrate structure 105. For example, the bridge die 101 may be located in a cavity of the multilayer substrate structure 105. One or more electrically insulating layers of the multilayer substrate structure 105 may be located around (e.g. formed laterally around) the bridge die 101 so that the bridge die may be electrically insulated from the substrate interconnects 106 of the multilayer substrate structure 105. At least part of an electrically insulating layer of the multilayer substrate structure may be located laterally around the bridge die 101 (e.g. on sidewalls of the bridge die 101) and/or may cover the back side and/or front side of the bridge die 101. A (vertical) thickness of an electrically insulating build up layer of the multilayer substrate structure may be between 2 μm and 35 μm (or e.g. between 15 μm and 30 μm), for example.

Optionally, the first bridge die pad 103 and the second bridge die pad 104 may be located at a front side of the bridge die 101.

The bridge die 101 may include a substrate die, which may be a glass die or a (high resistivity) silicon die. The plurality of bridge interconnects 102 may be routed through at least part of the bridge die 101. For example, a bridge interconnect 102 may include a first vertically extending portion connecting the first die pad 103 to a laterally extending portion of the bridge interconnect 102. The bridge interconnect 102 may further include a second vertically extending portion connecting the laterally extending portion to the second die pad 104. By repeating the processes of forming a lateral extending portion a surface of the substrate die, depositing an electrically insulating bridge substrate material and forming a vertically extending portion, the plurality of bridge interconnects 102 may be formed. Each bridge interconnect 102 may be electrically insulated from other bridge interconnects 102 by the electrically insulating bridge substrate material located between the bridge interconnects 102. The electrically insulating bridge substrate material may include silicon dioxide, high resistivity silicon or glass, for example. A thickness of the bridge die 101 may be less than 100 μm (or e.g. between 25 μm and 100 μm, or e.g. between 50 μm and 80 μm). Optionally, the bridge die 101 may be primarily (or solely) for routing electrical signals. For example, no transistors may be implemented on the bridge die 101 and/or the bridge die 101 may have no electrically active doping regions. For example, the implantation of dopants into the bridge die 101 may be unnecessary, if no transistors and diodes are implemented on the on the bridge die 101.

Each substrate interconnect 106 may be configured to provide a route for an electrical signal, which may be carried or relayed through the multilayer substrate structure by the substrate interconnect 106. The plurality of substrate interconnects 106 may extend through at least part of the electrically insulating substrate. For example, one or more substrate interconnects 106 of the plurality of substrate interconnects may extend (substantially vertically) through the electrically insulating substrate from a front side of the multilayer substrate structure 105 towards (or to) the back surface of the multilayer substrate structure 105.

A portion of each substrate interconnect 106 may lie at a level above the bridge die and a further portion of the substrate interconnect may lie at a level below the bridge die. Additionally or optionally, one or more further substrate interconnects 106 of the plurality of substrate interconnects may extend from the front side of the multilayer substrate structure towards the back surface of the multilayer substrate structure, but may end before reaching the back surface of the multilayer substrate structure. Additionally or optionally, one or more substrate interconnects 106 of the plurality of substrate interconnects may be ohmically or electrically connected to other substrate interconnects of the multilayer substrate structure.

The substrate interconnect 106 (or each substrate interconnect of the plurality of substrate interconnects) may include a plurality of lateral wiring layers and a plurality of vertical wiring layers arranged alternatingly with respect to each other in a substantially vertical direction.

The substrate interconnect 106 may include a first vertical wiring layer. At least a portion of the first vertical wiring layer of the substrate interconnect 106 may be located at the same level as the first via portion 107. A maximal lateral dimension of the first vertical wiring layer of the substrate interconnect 106 may be larger than 30 μm (or e.g. larger than 40 μm, or e.g. larger than 45 μm). For example, the maximal lateral dimension of the vertical wiring layer may be at least 1.5 times (or e.g. at least 2 times, or e.g. at least 3 times, or e.g. at least 5 times, or e.g. at least 10 times) the maximal lateral dimension of the first via portion 107. As the first vertical wiring layer of the substrate interconnect 106 may be a laser drilled via, the sidewalls of the first vertical wiring layer of the substrate interconnect 106 may have aggressive tapering compared to lithographically defined vias (e.g. the first via portion 107 and the second via portion). For example, an average angle, b, between a lateral surface of an electrically insulating build-up layer of the multilayer structure and a sidewall of the first vertical wiring layer of the substrate interconnect 106 may be less than 80° (or e.g. less than 75°, or e.g. less than 70°).

A (vertical) thickness of a lateral wiring layer of the substrate interconnect 106 may be between 5 μm and 20 μm (or e.g. between 10 μm and 15 μm), for example.

Depending on the desired wiring layout, a lateral wiring layer of a first substrate interconnect 106 may be ohmically or electrically connected (at the same lateral level) to a lateral wiring layer of a second substrate interconnect 106. In this way, an electrical signal may be routed between the first substrate interconnect and the second substrate interconnect.

The (or each) substrate interconnect may be electrically insulated from the bridge die by at least part of the electrically insulating substrate. For example, at least part of the electrically insulating substrate of the multilayer substrate structure 105 may be located between the bridge die and the substrate interconnect. For example, at least part of the electrically insulating substrate may surround (e.g. laterally surround) the substrate interconnect.

The die interconnect substrate 300 may further include a plurality of first contact interface structures, which may each be connected to a bridge die pad of the bridge die 101. Optionally, the plurality of first contact interface structures may each be connected to the bridge die pads of the first group of bridge die pads. The die interconnect substrate may further include a plurality of second contact interface structures, which may each be connected to a substrate interconnect of the multilayer substrate structure 105. The plurality of first contact interface structures and the plurality of second contact interface structures may be located at the front side of the multilayer substrate structure 105. The plurality of first contact interface structures and the plurality of second contact interface structures may be copper (Cu)-based interface structures.

A minimal (or smallest) lateral dimension (width) of the first contact interface structure 247 may lie between 15 μm and 20 μm (or e.g. between 15 μm and 18 μm), for example. A maximal (or largest) lateral dimension of the first contact interface structure 247 may lie between 15 μm and 30 μm (or e.g. between 18 μm and 28 μm), for example.

Each first (contact) interface structure may be (or may include at least part of) a solder bump structure for providing an ohmic or electrical contact to a semiconductor device. Similarly, each second (contact) interface structure may be (or may include at least part of) a different solder bump structure for providing an ohmic or electrical contact to a semiconductor device. For example, the first contact interface structure and the second contact interface structure may each be configured for attaching a semiconductor device to the multilayer substrate structure 105 via a controlled collapse chip connection C4 (e.g. a flip chip connection).

Both the first contact interface structure and the second contact interface structure may protrude from (or may be exposed at) the front surface of the multilayer substrate structure 105. The first contact interface structure and the second contact interface structure may be electrically insulated (and/or separated) from each other by solder resist material of a solder resist layer. A (vertical) thickness of the solder resist layer may be between 10 μm and 35 μm (or e.g. between 15 μm and 30 μm), for example.

A bump pitch may be a distance between a center of a contact interface structure and a center of an adjacent contact interface structure, for example. The bump pitch, p, between two adjacent first contact interface structures may lie between 30 μm and 45 μm (or e.g. between 30 μm and 40 μm), for example. Additionally or optionally, a minimal (or smallest) distance between adjacent interface structures of the plurality of first contact interface structures may be less than 30 μm (or e.g. less than 25 μm, or e.g. less than 30 μm). A minimal (or smallest) distance between adjacent interface structures of the plurality of second contact interface structures may be larger than 30 μm (or e.g. larger than 40 μm, or e.g. larger than 50 μm).

A maximal (or largest) lateral dimension (e.g. a width) of the first contact interface structure may be smaller than the second contact interface structure. For example, a maximal lateral dimension of the second contact interface structure may be at least 1.5 times (or e.g. 2 times, or e.g. 3 times) a maximal lateral dimension of the first contact interface structure.

Additionally, the die interconnect substrate may include a surface finish layer which may be located at the lateral surface of the first contact interface structure and at the lateral surface of the second contact interface structure.

Thus, the multilayer substrate structure 105 may be attached (or e.g. soldered to) a semiconductor device via the first contact interface structure and the second contact interface structure. Optionally, the first contact interface structure and the second contact interface structure may be attached to the same semiconductor device. However, alternatively, it may be possible that the first contact interface structure may be attached to a first semiconductor device and the second contact interface structure may be attached to a second semiconductor device.

The die interconnect substrate 100 may further include a plurality of third interface structures located at the back surface of the multilayer substrate structure 105. The plurality of third interface structures may be for attaching the multilayer substrate structure 105 to a carrier (e.g. to a printed circuit board) at the back surface of the multilayer substrate structure 105. Optionally, one or more substrate interconnects 106 of the multilayer substrate structure 105 may be further connected to the third interface structure. For example, one or more substrate interconnects 106 may each be connected between a second contact interface structure at the front surface of the multilayer substrate structure 105 and the third interface structure at the back surface of the multilayer substrate structure.

Additionally, or optionally, the die interconnect substrate 400 may further include a fourth interface structure located at the front surface of the multilayer substrate structure 105 for attaching a passive component to the multilayer substrate structure 105. Alternatively, the passive component may be a capacitor (e.g. a die side capacitor DSC) or a host fabric interface (HFI). Optionally, the die interconnect substrate 400 may include a fourth interface structure for attaching a DSC to the multilayer substrate structure 105, and a fifth interface structure for attaching a HFI to the multilayer substrate structure 105.

Generally, besides semiconductor devices, one or more other structures may be connected to one or more front side (or back side) contact interface structures. The one or more other structures may be a processor circuit (e.g. central processing unit CPU), a memory circuit, a (wireless or wireline) transmitter circuit and/or a (wireless or wireline) receiver circuit implemented on a semiconductor die.

A thickness of the multilayer substrate structure 105 may be at least 700 μm (or e.g. at least 900 μm, or e.g. at least 1 mm). For example, the thickness of the multilayer substrate structure 105 may be a (vertical) distance between a lateral surface of the first contact interface structure located at the front side of the multilayer substrate structure 105 and a lateral surface of a third interface structure located at the back side of the multilayer substrate structure 105.

A lateral surface (e.g. of the bridge die, or a substrate) may be a substantially even plane (e.g. neglecting unevenness of the die due to the manufacturing process and trenches). The lateral surface may be substantially perpendicular (or orthogonal) to a vertical edge of the die. For example, in comparison to a (substantially vertical or orthogonal) edge of the die, the lateral surface may be a basically horizontal surface extending laterally. The lateral dimension of the lateral surface of the die may be more than 100 times larger (or more than 1000 times or more than 10000 times) than a basically vertical dimension (or height) of a vertical edge of the die, for example. A lateral dimension or lateral distance may be a dimension or distance measured in a direction substantially horizontal to the lateral surface of the die.

A maximal (or largest) lateral dimension (e.g. width), of the first via portion 107 may lie between 3 μm and 20 μm (or e.g. between 5 μm and 15 μm, or e.g. less than 10 μm), for example. Additionally, very little to almost no tapering (e.g. almost zero sidewall tapering) may exist in the sidewalls of the via portion 107. For example, the sidewalls of the via portion 107 may be substantially vertical. The average angle, a, between a (lateral) surface of the bridge die pad and a sidewall 108 of the via portion 107 may lie between 85° and 95° (or e.g. between 87° and 93°). The average angle may be an angle measured between the sidewall 108 of the via portion and the bridge die pad 103 over more than 80% (or e.g. more than 90%, or e.g. more than 95%, or e.g. more than 99%) of the sidewall 108 of the via portion 107. Additionally or optionally, an average angle between the sidewall 108 of the via portion 107 and the lateral surface of the substrate die (of the bridge die 101) may lie between 85° and 95° (or e.g. between 87° and 93°). For example, the sidewall 108 of the via portion 107 may be perpendicular to the surface of the first bridge die pad.

A maximal lateral dimension (or width) of a bridge die pad (e.g. the first bridge die pad 103, or e.g. the second bridge die pad 104) may lie between 20 µm and 40 µm (or e.g. between 20 µm and 35 µm, or e.g. between 25 µm and 35 µm, or e.g. may be less than 40 µm), for example.

The multilayer substrate structure may include a plurality of electrically insulating (build-up) layers forming at least part of the multilayer substrate structure. The plurality of electrically insulating (build-up) layers may form an electrically insulating substrate. The electrically insulating substrate may be a polymer-based, epoxy-based and/or laminate based substrate. For example, the electrically insulating substrate may optionally include an electrically insulating core and/or the electrically insulating (dielectric) build-up layers.

The die interconnect substrate 300 may further include a filler structure located between the bridge die 101 and the multilayer substrate structure 105. The filler structure may be an electrically conductive filler structure. For example, the filler structure may include an electrically conductive material (e.g. copper). An average lateral dimension (or width) of the filler structure may lie between 5 µm and 15 µm (or e.g. between 5 µm and 10 µm).

More details and aspects are mentioned in connection with the examples described above or below. The examples shown in FIG. 3 may comprise one or more optional additional features corresponding to one or more aspects mentioned in connection with the proposed concept or one or more examples described above (e.g. FIGS. 1 to 2J) or below (e.g. FIGS. 4 to 5).

FIG. 4 shows a schematic illustration of an electrical device 400.

The electrical device 400 comprises a die interconnect substrate (300).

The die interconnect substrate comprises a bridge die 101 comprising at least one bridge interconnect 102 connecting a first bridge die pad 103 of the bridge die 101 to a second bridge die pad 104 of the bridge die 101. The die interconnect substrate further comprises a multilayer substrate structure 105 comprising a substrate interconnect 106. The bridge die 101 is embedded in the multilayer substrate structure 105. The die interconnect substrate further comprises a via portion 107 formed on the first bridge die pad 103 of the bridge die 101. An average angle between a lateral surface of the first bridge die pad 103 and a sidewall 108 of the via portion 107 lies between 85° and 95°.

The electrical device 400 further comprises a first semiconductor device 412 connected to the first bridge die pad 103.

The electrical device 400 further comprises a second semiconductor device 413 connected to the second bridge die pad 104.

Due to the average angle between the lateral surface of the first bridge die pad 103 and the sidewall 108 of the via portion lying between 85° and 95°, enlarged via portions (e.g. cone shaped via portions) may be avoided. This may lead to a reduction in a distance between solder structures (e.g. smaller bump pitch) connected to the via portions. A scaled down (or reduced) bump pitch may lead to smaller semiconductor devices being produced and at lower cost, for example.

The first semiconductor device 412 and the second semiconductor device 413 may respectively (or may be) a processor circuit (e.g. central processing unit CPU), a memory circuit, a (wireless or wireline) transmitter circuit and/or a (wireless or wireline) receiver circuit implemented on a semiconductor die. Alternatively, or optionally the first semiconductor device 412 and the second semiconductor device 413 may be a passive component such as a capacitor (e.g. a die side capacitor DSC) or a host fabric interface (HFI).

More details and aspects are mentioned in connection with the examples described above or below. The examples shown in FIG. 4 may comprise one or more optional additional features corresponding to one or more aspects mentioned in connection with the proposed concept or one or more examples described above (e.g. FIGS. 1 to 3) or below (e.g. FIG. 5).

FIG. 5 shows a schematic illustration of a semiconductor package 500 including the electrical device 400.

The semiconductor package 500 may include a plurality of semiconductor devices 412, 413, 556 (e.g. dies). The semiconductor devices 412, 413, 556 may be connected to the bridge dies via contact interface structures 557 (e.g. solder structures or e.g. c4 solder bumps).

The bridge interconnects 102 of each bridge die 101 may provide an electrical route between a first semiconductor device 412 and a second semiconductor device 413, for example.

The multilayer substrate structure 105 may include a plurality of substrate interconnects 106. Each substrate interconnect 106 may be configured to provide a route for an electrical signal through the multilayer substrate structure. The plurality of substrate interconnects 106 may extend through at least part of the electrically insulating substrate from a front side (or first) of the multilayer substrate structure 105 towards (or to) the back (or second) surface of the multilayer substrate structure 105.

A plurality of back side contact interface structures 558 of the die interconnect substrate 300 may be located at the back side of the die interconnect substrate 300 for connecting the electrical device 400 (and/or the semiconductor package 500) to an external carrier structure (e.g. to a printed circuit board PCB), for example. The plurality of back side contact interface structures 558 may be connected to the plurality of substrate interconnects 106 of the multilayer substrate structure, for example. The plurality of back side contact interface structures 558 may be solder bumps 558 (e.g. ball grid array bumps).

The die interconnect substrate 300 of the semiconductor package 500 may be connected to the external carrier structure 552. The carrier structure 552 may be an organic substrate (e.g. package carrier substrate or printed circuit board PCB). The carrier structure 552 may be soldered to (e.g. all back side contact interface structure of) the plurality of back side contact interface structures 558 forming solder connections between the carrier structure 552 and the die interconnect substrate 300.

As shown in FIG. 5, the die interconnect substrate 300, the first semiconductor device 412 and the second semiconductor device 413 and optionally an external carrier structure 552 may be arranged in a common (e.g. the same) semiconductor package 500. The components of the electrical device 400 may be embedded in the semiconductor package. For example, the components of the electrical device 400, such as the die interconnect substrate 300 and the semiconductor devices 412, 413, 556 may be partially or fully surrounded by a package material 551. The package material may be an epoxy, a plastic and/or a mold compound, for example. Optionally, the carrier structure 552 may be a package substrate of the common semiconductor package 500.

More details and aspects are mentioned in connection with the examples described above or below. The examples shown in FIG. 5 may comprise one or more optional additional features corresponding to one or more aspects mentioned in connection with the proposed concept or one or more examples described above (e.g. FIGS. 1 to 4) or below.

Various examples relate to an embedded bridge with lithographic pillars. The lithographically defined vias (pillars) may form a connection between the bridge and the substrate layers. The process for forming lithographically defined vias may be a viable process for fabricating vertical interconnects between metal layers.

The aspects and features (e.g. the die interconnect substrate, the bridge die, the at least one bridge interconnect, the first bridge die pad, the second bridge die pad, the multilayer substrate structure, the substrate interconnect, the uppermost electrically insulating layer, the common electrically insulating layer the via portion, the first vertical wiring layer of the substrate interconnect, the vertical wiring layers, the lateral wiring layers, the filler structure, the first contact interface structure, the electrical device, the second contact interface structure, the surface finish layer, the bridge contact structure, the third interface structure and the fourth interface structure) mentioned and described together with one or more of the previously detailed examples and figures, may as well be combined with one or more of the other examples in order to replace a like feature of the other example or in order to additionally introduce the feature to the other example.

There is a demand to provide concepts for semiconductor devices with reduced size, improved current carrying capabilities, and/or which may be produced at lower costs.

In the following, examples pertain to further examples.

Example 1 is a die interconnect substrate, comprising: a bridge die comprising at least one bridge interconnect connecting a first bridge die pad of the bridge die to a second bridge die pad of the bridge die; a multilayer substrate structure comprising a substrate interconnect, wherein the bridge die is embedded in the multilayer substrate structure; and a via portion formed on the first bridge die pad of the bridge die, wherein an average angle between a surface of the first bridge die pad and a sidewall of the via portion lies between 85° and 95°.

In example 2, the subject matter of example 1 can optionally include the sidewall of the via portion being perpendicular to the surface of the first bridge die pad.

In example 3, the subject matter of example 1 or 2 can optionally include a maximal width of the via portion being less than 10 µm.

In example 4, the subject matter of any of examples 1 to 3 can optionally include a maximal width of the bridge die pad being less than 40 µm.

In example 5, the subject matter of any of examples 1 to 4 can optionally include the multilayer substrate structure comprising a plurality of electrically insulating layers.

In example 6, the subject matter of any of examples 1 to 5 can optionally include the plurality of electrically insulating layers being build-up film layers.

In example 7, the subject matter of any of examples 1 to 6 can optionally further include a first contact interface structure for attaching a semiconductor die to the multilayer substrate structure, wherein the first contact interface structure is connected to the first bridge die pad; and a second contact interface structure for attaching a semiconductor die to the multilayer substrate structure, wherein the second contact interface structure is connected to the substrate interconnect.

In example 8, the subject matter of example 7 can optionally include the first contact interface structure and the second contact interface structure being configured for attaching a semiconductor die to the multilayer substrate structure via a controlled collapse chip connection.

In example 9, the subject matter of any of examples 1 to 8 can optionally include the bridge die comprising a substrate die, wherein the bridge interconnect is formed on the substrate die.

In example 10, the subject matter of example 9 can optionally include the substrate die being a glass die or a silicon die.

In example 11, the subject matter of any of examples 1 to 10 can optionally include the substrate interconnect extending from a level above the bridge die to a level below the bridge die.

In example 12, the subject matter of any of examples 1 to 11 can optionally include the substrate interconnect being electrically insulated from the bridge die.

In example 13, the subject matter of any of examples 1 to 12 can optionally include a filler structure located between the bridge die and the multilayer substrate structure.

In example 14, the subject matter of example 13 can optionally include the filler structure comprising an electrically conductive material.

Example 15 is an electrical device, comprising: a die interconnect substrate according to any of examples 1 to 14; a first semiconductor device connected to the first bridge die pad; and a second semiconductor device connected to the second bridge die pad.

In example 16, the subject matter of example 15 can optionally include the die interconnect substrate, the first semiconductor device and the second semiconductor device being arranged in a common package.

Example 17 is a method for forming a die interconnect substrate, the method comprising:

placing a bridge die in a cavity of a multilayer substrate structure, wherein the bridge die comprises at least one bridge interconnect connecting a first bridge die pad of the bridge die to a second bridge die pad of the bridge die; forming a mask layer on the bridge die; removing portions of the mask layer to form openings exposing at least part of the first bridge die pad and the second bridge die pad by a lithographic process; and forming electrically conductive material in the openings of the mask layer to form a via portion on the first bridge die pad.

In example 18, the subject matter of example 17 can optionally further include forming a continuous seed layer on at least part of the first bridge die pad and the second bridge die pad before forming the mask layer on the bridge die.

In example 19, the subject matter of example 17 or 18 can optionally include that forming the electrically conductive material in the openings of the mask layer comprises electroplating the electrically conductive material onto at least part of the continuous seed layer.

In example 20, the subject matter of any of examples 17 to 19 can optionally include the electrically conductive material comprising copper.

In example 21, the subject matter of any of examples 17 to 20 can optionally include that before forming the via portion on the first bridge die pad, the multilayer substrate structure comprises a plurality of electrically insulating layers, wherein an uppermost electrically insulating layer of the plurality of electrically insulating layers forms a surface of the multilayer substrate structure next to the cavity.

In example 22, the subject matter of any of examples 17 to 21 can optionally include the plurality of electrically insulating layer being dielectric build-up film layers.

In example 23, the subject matter of any of examples 17 to 22 can optionally further include forming a filler structure filling a gap located between the bridge die and the multilayer substrate structure after forming the via portion.

In example 24, the subject matter of example 23 can optionally include that forming the filler structure comprises placing a common electrically insulating layer on a surface of the multilayer structure and applying pressure to the common electrically insulating laminate layer so that a portion of the common electrically insulating laminate layer is pressed into the gap.

In example 25, the subject matter of example 24 can optionally include removing at least part of the common electrically insulating layer until the via portion is exposed.

In example 26, the subject matter of example 25 can optionally include that removing at least part of the common electrically insulating layer comprises at least one of chemical etching, planarizing, plasma etching and mechanical grinding the common electrically insulating layer.

In example 27, the subject matter of any of examples 24 to 26 can optionally include the common electrically insulating layer being a dielectric build-up film layer.

In example 28, the subject matter of any of examples 17 to 22 can optionally include forming electrically conductive material to form the via portion and an electrically conductive filler structure filling a gap located between the bridge die and the multilayer substrate structure in the same process.

In example 29, the subject matter of any of examples 17 to 28 can optionally include that before forming the via portion on the first bridge die pad, the multilayer substrate structure further comprises a substrate interconnect, wherein a portion of the substrate interconnect is located at a level below the bridge die.

In example 30, the subject matter of example 29 can optionally include the substrate interconnect comprising a plurality of lateral wiring layers arranged alternatingly with respect to a plurality of vertical wiring layers.

In example 31, the subject matter of example 29 or 30 can optionally further include forming a first vertical wiring layer of the substrate interconnect after forming the via portion.

In example 32, the subject matter of example 31 can optionally include that forming the first vertical wiring layer of the substrate interconnect comprises: forming an opening in an uppermost electrically insulating layer and a common electrically insulating layer of the multilayer substrate structure to expose at least part of the substrate interconnect by a laser process; and forming electrically conductive material in the opening of the uppermost electrically insulating layer and the common electrically insulating layer to form the first vertical wiring layer of the substrate interconnect.

In example 33, the subject matter of example 31 or 32 can optionally include forming in the same process the electrically conductive material for forming the first vertical wiring layer of the substrate interconnect, a first lateral wiring layer of the substrate interconnect and a first lateral wiring layer of a bridge contact structure to be formed.

In example 34, the subject matter of example 33 can optionally include that forming the first lateral wiring layer of the substrate interconnect and the first lateral wiring layer of the bridge contact structure to be formed comprises forming a mask layer on a surface of the multilayer substrate structure and removing portions of the mask layer to form openings exposing the via portion and the opening in the uppermost electrically insulating layer and the common electrically insulating layer by a lithographic process; and forming electrically conductive material in the openings of the mask layer to form the first lateral wiring layer of the substrate interconnect and the first lateral wiring layer of the bridge contact structure.

In example 35, the subject matter of any of examples 17 to 34 can optionally further include simultaneously forming a first contact interface structure and a second contact interface structure, wherein the first contact interface structure is connected to the first bridge die pad and wherein the second contact interface structure is connected to the substrate interconnect.

In example 36, the subject matter of example 35 can optionally include that forming the first contact interface structure and the second contact interface structure comprises: forming a solder resist mask layer at a surface of the multilayer substrate structure and forming openings in the solder resist mask layer; and forming electrically conductive material in the openings of the solder resist mask layer to form the first contact interface structure connected to the substrate interconnect and the second contact interface structure connected to the bridge die.

In example 37, the subject matter of any of examples 17 to 36 can optionally further include attaching a semiconductor device to the first bridge die pad of the bridge die.

In example 38, the subject matter of example 37 can optionally further include attaching a second semiconductor device to the second bridge die pad of the bridge die.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A die interconnect substrate, comprising:
   a bridge die comprising at least one bridge interconnect connecting a first bridge die pad of the bridge die to a second bridge die pad of the bridge die;
   a multilayer substrate structure comprising a substrate interconnect, wherein the bridge die is embedded in the multilayer substrate structure, and wherein an average angle between a lateral surface of an electrically insulating build-up layer of the multilayer substrate structure and a sidewall of the substrate interconnect is less than 80'; and
   a via portion in the multilayer substrate structure, the via portion on the first bridge die pad of the bridge die, wherein an average angle between a surface of the first bridge die pad and a sidewall of the via portion lies between 85° and 95°.

2. The die interconnect substrate according to claim 1, wherein the sidewall of the via portion is perpendicular to the surface of the first bridge die pad.

3. The die interconnect substrate according to claim 1, wherein a maximal width of the via portion is less than 10 µm.

4. The die interconnect substrate according to claim 1, wherein a maximal width of the bridge die pad is less than 40 µm.

5. The die interconnect substrate according to claim 1, wherein the multilayer substrate structure comprises a plurality of electrically insulating layers.

6. The die interconnect substrate according to claim 5, wherein the plurality of electrically insulating layers are build-up film layers.

7. The die interconnect substrate according to claim 1, further comprising:
   a first contact interface structure for attaching a semiconductor die to the multilayer substrate structure, wherein the first contact interface structure is connected to the first bridge die pad; and
   a second contact interface structure for attaching the semiconductor die to the multilayer substrate structure, wherein the second contact interface structure is connected to the substrate interconnect.

8. The die interconnect substrate according to claim 7, wherein the first contact interface structure and the second contact interface structure are configured for attaching the semiconductor die to the multilayer substrate structure via a controlled collapse chip connection.

9. The die interconnect substrate according to claim 1, wherein the bridge die comprises a substrate die, wherein the bridge interconnect is formed on the substrate die.

10. The die interconnect substrate according to claim 9, wherein the substrate die is a glass die or a silicon die.

11. The die interconnect substrate according to claim 1, wherein the substrate interconnect extends from a level above the bridge die to a level below the bridge die.

12. The die interconnect substrate according to claim 1, wherein the substrate interconnect is electrically insulated from the bridge die.

13. The die interconnect substrate according to claim 1, further comprising a filler structure located between the bridge die and the multilayer substrate structure.

14. The die interconnect substrate according to claim 13, wherein the filler structure comprises an electrically conductive material.

15. An electrical device, comprising:
   a die interconnect substrate comprising a bridge die comprising at least one bridge interconnect connecting a first bridge die pad of the bridge die to a second bridge die pad of the bridge die;
   a first semiconductor device connected to the first bridge die pad; and
   a second semiconductor device connected to the second bridge die pad, wherein the die interconnect substrate further comprises a multilayer substrate structure comprising a substrate interconnect, wherein an average angle between a lateral surface of an electrically insulating build-up layer of the multilayer substrate structure and a sidewall of the substrate interconnect is less than 80°, wherein the bridge die is embedded in the multilayer substrate structure, wherein the die interconnect substrate further comprises a via portion in the multilayer substrate structure, the via portion on the first bridge die pad of the bridge die, and wherein an average angle between a surface of the first bridge die pad and a sidewall of the via portion lies between 85° and 95°.

16. The electrical device according to claim 15, wherein the die interconnect substrate, the first semiconductor device and the second semiconductor device are arranged in a common package.

17. A method for forming a die interconnect substrate, the method comprising:
   placing a bridge die in a cavity of a multilayer substrate structure, the multilayer substrate structure comprising a substrate interconnect, wherein an average angle between a lateral surface of an electrically insulating build-up layer of the multilayer substrate structure and a sidewall of the substrate interconnect is less than 80°, and wherein the bridge die comprises at least one bridge interconnect connecting a first bridge die pad of the bridge die to a second bridge die pad of the bridge die;
   forming a mask layer on the bridge die;

removing portions of the mask layer to form openings exposing at least part of the first bridge die pad and the second bridge die pad by a lithographic process; and forming electrically conductive material in the openings of the mask layer to form a via portion in the multilayer substrate structure, the via portion on the first bridge die pad.

18. The method according to claim 17, further comprising forming a continuous seed layer on at least part of the first bridge die pad and the second bridge die pad before forming the mask layer on the bridge die.

19. The method according to claim 18, wherein forming the electrically conductive material comprises electroplating the electrically conductive material onto at least part of the continuous seed layer.

20. The method according to claim 17, wherein the electrically conductive material comprises copper.

21. The method according to claim 17, wherein before forming the via portion on the first bridge die pad, the multilayer substrate structure comprises a plurality of electrically insulating layers, wherein an uppermost electrically insulating layer of the plurality of electrically insulating layers forms a surface of the multilayer substrate structure next to the cavity.

22. The method according to claim 21, wherein the plurality of electrically insulating layer are dielectric build-up film layers.

23. The method according to claim 17, further comprising forming a filler structure filling a gap located between the bridge die and the multilayer substrate structure after forming the via portion.

24. The method according to claim 23, wherein forming the filler structure comprises placing a common electrically insulating layer on a surface of the multilayer structure and applying pressure to the common electrically insulating laminate layer so that a portion of the common electrically insulating laminate layer is pressed into the gap.

25. The method according to claim 24, further comprising removing at least part of the common electrically insulating layer until the via portion is exposed.

\* \* \* \* \*